United States Patent
Hagiya et al.

(10) Patent No.: US 9,449,623 B2
(45) Date of Patent: Sep. 20, 2016

(54) REDUCING ION MIGRATION IN A HARD DISK DRIVE MICROACTUATOR FLEXURE ASSEMBLY

(71) Applicant: HGST Netherlands B.V., Amsterdam (NL)

(72) Inventors: Shinobu Hagiya, Fujisawa (JP); Haruhide Takahashi, Odawara (JP); Kousaku Wakatsuki, Odawara (JP)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/295,296

(22) Filed: Jun. 3, 2014

(65) Prior Publication Data

US 2015/0348577 A1    Dec. 3, 2015

(51) Int. Cl.
*G11B 5/48* (2006.01)
*H01L 41/04* (2006.01)
*H01L 41/09* (2006.01)

(52) U.S. Cl.
CPC ............... *G11B 5/48* (2013.01); *G11B 5/483* (2015.09); *G11B 5/4873* (2013.01); *H01L 41/042* (2013.01); *H01L 41/0933* (2013.01); *Y10T 29/43* (2015.01)

(58) Field of Classification Search
USPC .............................................. 360/291.9, 292
See application file for complete search history.

(56) References Cited

U.S. PATENT DOCUMENTS

| | | | |
|---|---|---|---|
| 4,689,514 A * | 8/1987 | Kondoh et al. | 310/323.21 |
| 7,359,154 B2 | 4/2008 | Yao et al. | |
| 8,085,508 B2 * | 12/2011 | Hatch | 360/294.4 |
| 8,159,790 B2 | 4/2012 | Tan et al. | |
| 8,369,047 B2 | 2/2013 | Fujimoto et al. | |
| 8,498,082 B1 | 7/2013 | Padeski et al. | |
| 8,699,186 B1 * | 4/2014 | Hahn et al. | 360/244.9 |
| 2003/0135985 A1 | 7/2003 | Yao et al. | |
| 2011/0013319 A1 * | 1/2011 | Soga et al. | 360/246.1 |
| 2014/0022675 A1 * | 1/2014 | Hanya et al. | 360/244.5 |

FOREIGN PATENT DOCUMENTS

EP    1596371 A1    11/2005

OTHER PUBLICATIONS

Hiroyuki Kubotera et al., Effect of various physical factors on thin lubricant film migration on the flying head slider at the head-disk interface of hard disk drives, Journal of Applied Physics, Sep. 2007, pp. 054309-054309-6, vol. 102 Issue 5, AIP Publishing.

* cited by examiner

*Primary Examiner* — Carlos E Garcia
(74) *Attorney, Agent, or Firm* — John D. Henkhaus (57) ABSTRACT

Approaches to a suspension for a hard disk drive include having an adhered one or more piezo actuating device driven by a negative bias driving voltage. The negative bias driving voltage is lower than ground, therefore such voltage inhibits the migration of ions of an electrically conductive adhesive to an electrically conductive flexure layer, and inhibits the degradation of the resistance of an insulating material positioned between the conductive adhesive and the conductive flexure layer.

15 Claims, 5 Drawing Sheets

ATTACH, USING AN ELECTRICALLY CONDUCTIVE ADHESIVE, ONE OR MORE PIEZO ACTUATING DEVICE TO A FLEXURE COMPRISING AN ELECTRICALLY CONDUCTIVE LAYER COUPLED TO GROUND
602

ELECTRICALLY COUPLE A NEGATIVE BIAS VOLTAGE SOURCE TO THE ONE OR MORE PIEZO ACTUATING DEVICE, WHERE A NEGATIVE BIAS DRIVING VOLTAGE PROVIDED BY THE VOLTAGE SOURCE INHIBITS THE MIGRATION OF IONS OF THE ELECTRICALLY CONDUCTIVE ADHESIVE TO THE ELECTRICALLY CONDUCTIVE LAYER OF THE FLEXURE
604

ENCAPSULATE AT LEAST A PORTION OF THE ELECTRICALLY CONDUCTIVE ADHESIVE WITH AN INSULATING MATERIAL POSITIONED BETWEEN THE ELECTRICALLY CONDUCTIVE ADHESIVE AND THE ELECTRICALLY CONDUCTIVE LAYER OF THE FLEXURE, WHERE THE NEGATIVE BIAS DRIVING VOLTAGE INHIBITS THE DEGRADATION OF THE RESISTANCE OF THE INSULATING MATERIAL
606

FIG. 6

REDUCING ION MIGRATION IN A HARD DISK DRIVE MICROACTUATOR FLEXURE ASSEMBLY

FIELD OF THE INVENTION

Embodiments of the invention may relate generally to a hard disk drive and more particularly to a piezoelectric (PZT) microactuator flexure assembly.

BACKGROUND

A hard disk drive (HDD) is a non-volatile storage device that is housed in a protective enclosure and stores digitally encoded data on one or more circular disks having magnetic surfaces. When an HDD is in operation, each magnetic-recording disk is rapidly rotated by a spindle system. Data is read from and written to a magnetic-recording disk using a read/write head that is positioned over a specific location of a disk by an actuator. A read/write head uses a magnetic field to read data from and write data to the surface of a magnetic-recording disk. Write heads make use of the electricity flowing through a coil, which produces a magnetic field. Electrical pulses are sent to the write head, with different patterns of positive and negative currents. The current in the coil of the write head induces a magnetic field across the gap between the head and the magnetic disk, which in turn magnetizes a small area on the recording medium.

Increasing areal density (a measure of the quantity of information bits that can be stored on a given area of disk surface) is one of the ever-present goals of hard disk drive design evolution, and has led to the necessary development and implementation of secondary and even tertiary actuators for improved head positioning through relatively fine positioning, in addition to a primary voice coil motor (VCM) actuator which provides relatively coarse positioning. Some hard disk drives employ micro- or milli-actuator designs to provide second stage actuation of the recording head to enable more accurate positioning of the head relative to the recording track. Milli-actuators are broadly classified as actuators that move the entire front end of the suspension: spring, load beam, flexure and slider. Micro-actuators are broadly classified as actuators that move only the slider, moving it relative to the load beam, or moving the read-write element only, moving it relative to the slider body.

Piezoelectric (PZT) based and capacitive micro-machined transducers are two types of microactuators that have been proposed for use with HDD sliders. The microactuators need to be mechanically and electrically coupled to flexure support structure, with very limited mechanical tolerances, such as by using an electrically conductive adhesive. Thus, undesirable electrical shorts and/or current leakage may occur due to the miniscule spacing between electrical components.

Any approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

SUMMARY OF EMBODIMENTS

Embodiments of the invention are directed to a suspension for a hard disk drive (HDD), and an associated HDD and a method of manufacturing, having an adhered one or more piezo actuating device driven by a negative bias driving voltage. According to embodiments the negative bias driving voltage is lower than ground, therefore the negative bias driving voltage inhibits the migration of ions of an electrically conductive adhesive to an electrically conductive flexure layer, and inhibits the degradation of the resistance of an insulating material positioned between the conductive adhesive and the conductive flexure layer.

According to an embodiment, the negative bias driving voltage provides for a negative RMS AC voltage to the piezo actuating device, across the entire corresponding AC waveform. According to another embodiment, the negative bias driving voltage is a reduced bias voltage that provides for a negative RMS AC voltage to the piezo actuating device, across a majority of the corresponding AC waveform but not the entire waveform, whereby an increased amplitude driving signal may be used.

Embodiments discussed in the Summary of Embodiments section are not meant to suggest, describe, or teach all the embodiments discussed herein. Thus, embodiments of the invention may contain additional or different features than those discussed in this section. Furthermore, no limitation, element, property, feature, advantage, attribute, or the like expressed in this section, which is not expressly recited in a claim, limits the scope of any claim in any way.

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION

Approaches to a suspension for a hard disk drive (HDD), having an adhered one or more piezo actuating device driven by a negative bias driving voltage, are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form in order to avoid unnecessarily obscuring the embodiments of the invention described herein.

Physical Description of an Example Operating Environment

Figure 1:
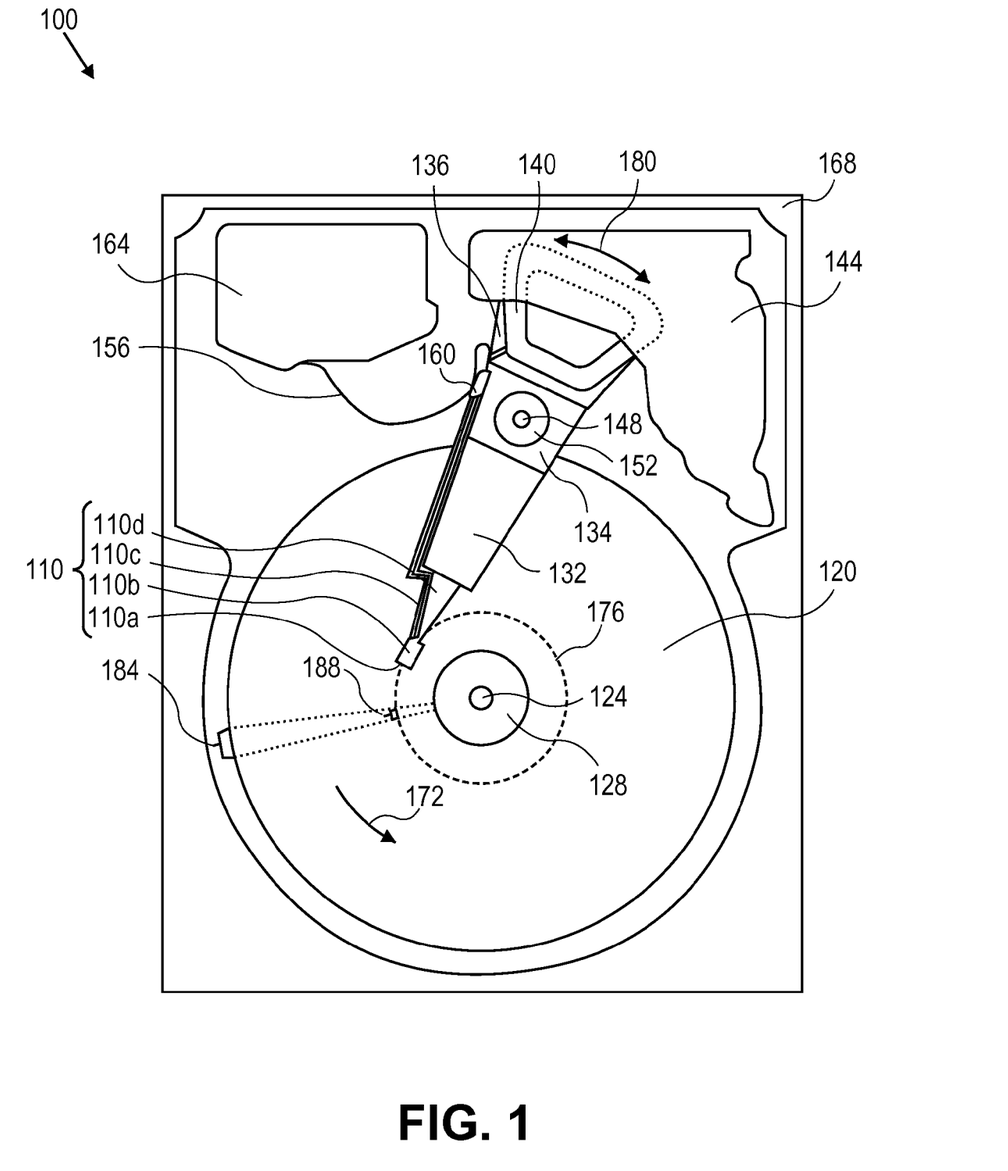
FIG. 1 is a plan view illustrating a hard disk drive, according to an embodiment of the invention.

Embodiments of the invention may be used in the context of improving microactuator reliability in a hard-disk drive (HDD) storage device. Thus, in accordance with an embodiment of the invention, a plan view illustrating an HDD 100 is shown in FIG. 1. FIG. 1 illustrates the functional arrangement of components of the HDD including a slider 110b that includes a magnetic-reading/recording head 110a. Collectively, slider 110b and head 110a may be referred to as a head slider. The HDD 100 includes at least one head gimbal assembly (HGA) 110 including the head slider, a lead suspension 110c attached to the head slider typically via a flexure, and a load beam 110d attached to the lead suspension 110c. The HDD 100 also includes at least one magnetic-recording media 120 rotatably mounted on a spindle 124 and a drive motor (not visible) attached to the spindle 124 for rotating the media 120. The head 110a includes a write element and a read element for respectively writing and reading information stored on the media 120 of the HDD 100. The media 120 or a plurality of disks may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134; and a stator 144 including a voice-coil magnet (not visible). The armature 136 of the VCM is attached to the carriage 134 and is configured to move the arm 132 and the HGA 110, to access portions of the media 120, being mounted on a pivot-shaft 148 with an interposed pivot-bearing assembly 152. In the case of an HDD having multiple disks, or platters as disks are sometimes referred to in the art, the carriage 134 is called an "E-block," or comb, because the carriage is arranged to carry a ganged array of arms that gives it the appearance of a comb.

An assembly comprising a head gimbal assembly (e.g., HGA 110) including a flexure to which the head slider is coupled, an actuator arm (e.g., arm 132) to which the flexure is coupled, and an actuator (e.g., the VCM) to which the actuator arm is coupled, may be collectively referred to as a head stack assembly (HSA). An HSA may, however, include more or fewer components than those described. For example, an HSA may refer to an assembly that further includes electrical interconnection components. Generally, an HSA is the assembly configured to move the head slider to access portions of the media 120 (e.g., magnetic-recording disks) for read and write operations.

With further reference to FIG. 1, in accordance with an embodiment of the present invention, electrical signals, for example, current to the voice coil 140 of the VCM, write signal to and read signal from the head 110a, are provided by a flexible interconnect cable 156 ("flex cable"). Interconnection between the flex cable 156 and the head 110a may be provided by an arm-electronics (AE) module 160, which may have an on-board pre-amplifier for the read signal, as well as other read-channel and write-channel electronic components. The AE 160 may be attached to the carriage 134 as shown. The flex cable 156 is coupled to an electrical-connector block 164, which provides electrical communication through electrical feedthroughs provided by an HDD housing 168. The HDD housing 168, also referred to as a casting, depending upon whether the HDD housing is cast, in conjunction with an HDD cover provides a sealed, protective enclosure for the information storage components of the HDD 100.

Continuing with reference to FIG. 1, in accordance with an embodiment of the present invention, other electronic components, including a disk controller and servo electronics including a digital-signal processor (DSP), provide electrical signals to the drive motor, the voice coil 140 of the VCM and the head 110a of the HGA 110. The electrical signal provided to the drive motor enables the drive motor to spin providing a torque to the spindle 124 which is in turn transmitted to the media 120 that is affixed to the spindle 124 by the disk clamp 128; as a result, the media 120 spins in a direction 172. The spinning media 120 creates a cushion of air that acts as an air-bearing on which the air-bearing surface (ABS) of the slider 110b rides so that the slider 110b flies above the surface of the media 120 without making contact with a thin magnetic-recording medium in which information is recorded.

The electrical signal provided to the voice coil 140 of the VCM enables the head 110a of the HGA 110 to access a track 176 on which information is recorded. Thus, the armature 136 of the VCM swings through an arc 180 which enables the HGA 110 attached to the armature 136 by the arm 132 to access various tracks on the media 120. Information is stored on the media 120 in a plurality of stacked tracks arranged in sectors on the media 120, for example, sector 184. Correspondingly, each track is composed of a plurality of sectored track portions (or "track sector"), for example, sectored track portion 188. Each sectored track portion 188 is composed of recorded data and a header containing a servo-burst-signal pattern, for example, an ABCD-servo-burst-signal pattern, information that identifies the track 176, and error correction code information. In accessing the track 176, the read element of the head 110a of the HGA 110 reads the servo-burst-signal pattern which provides a position-error-signal (PES) to the servo electronics, which controls the electrical signal provided to the voice coil 140 of the VCM, enabling the head 110a to follow the track 176. Upon finding the track 176 and identifying a particular sectored track portion 188, the head 110a either reads data from the track 176 or writes data to the track 176 depending on instructions received by the disk controller from an external agent, for example, a microprocessor of a computer system.

References herein to a hard disk drive, such as HDD 100 illustrated and described in reference to FIG. 1, may encompass a data storage device that is at times referred to as a "hybrid drive". A hybrid drive refers generally to a storage device having functionality of both a traditional HDD (see, e.g., HDD 100) combined with solid-state storage device (SSD) using non-volatile memory, such as flash or other solid-state (e.g., integrated circuits) memory, which is electrically erasable and programmable. As operation, management and control of the different types of storage media typically differs, the solid-state portion of a hybrid drive may include its own corresponding controller functionality, which may be integrated into a single controller along with the HDD functionality. A hybrid drive may be architected and configured to operate and to utilize the solid-state portion in a number of ways, such as, for non-limiting examples, by using the solid-state memory as cache memory, for storing frequently-accessed data, for storing I/O intensive data, and the like. Further, a hybrid drive may be architected and configured essentially as two storage devices in a single enclosure, i.e., a traditional HDD and an SSD, with either one or multiple interfaces for host connection.

Introduction

Embodiments of the invention are relevant to HGA microactuator designs. For example, embodiments may be particularly applicable to, but are not limited to, a flexure-integrated microactuator system such as the one described in U.S. Pat. No. 8,085,508 ("the '508 patent), the subject matter of which is incorporated by reference for all purposes as if fully set forth herein. The microactuator system described in the referenced '508 patent comprises two piezoelectric (PZT) motors placed within the flexure gimbal and located just proximal to the slider when viewed from the point of origin of the primary VCM actuator.

As mentioned, the microactuators need to be mechanically and electrically coupled to flexure support structure, all of which are relatively small and thin parts, with very limited space and a high degree of positional accuracy. Thus, undesirable electrical shorts or current leakage may occur, over time, such as due to ion migration associated with an electrically conductive adhesive and/or due to resistance degradation of an insulating material used to encapsulate the conductive adhesive.

Flexure Assembly

Figure 2:
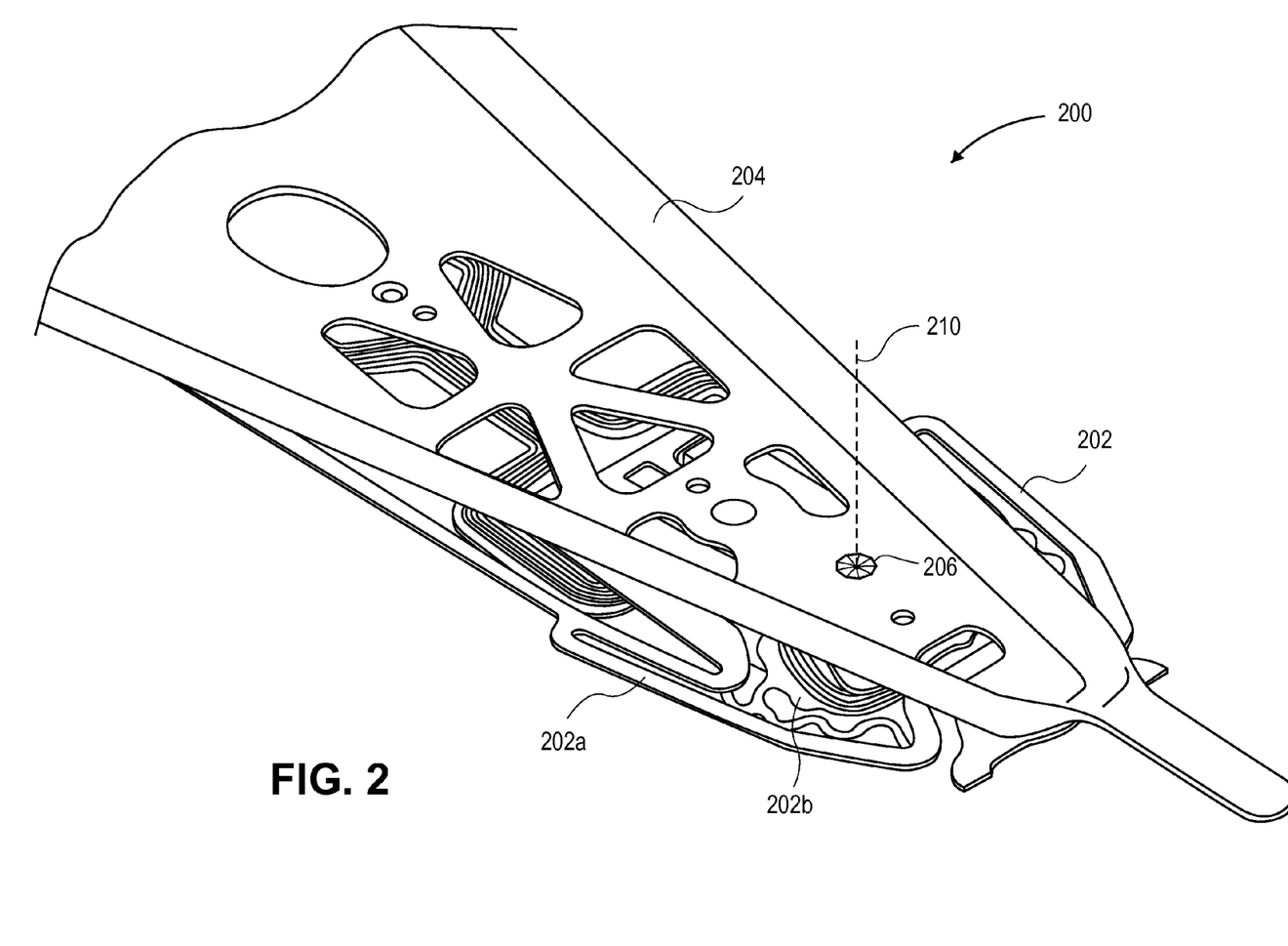
FIG. 2 is a perspective view illustrating a head gimbal assembly (HGA), according to an embodiment of the invention.

FIG. 2 is a perspective view illustrating a head gimbal assembly (HGA), according to an embodiment of the invention. An HGA may also be referred to as a flexure gimbal assembly. HGA 200 comprises a flexure 202 and a load beam 204 having a dimple 206. According to an embodiment, flexure 202 comprises multiple assembled layers such as a stainless steel layer 202a (also referred to herein as a "spring layer" due to one of its functional characteristics) coupled with an insulator (or "insulating") layer 202b. Flexure 202 may also, but need not, comprise a separate conductor layer, as described in the '508 patent. Flexure 202 is movably coupled to the loadbeam 204 via the gimbal 206 and has freedom of rotation about the dimple axis 210. Because a slider is coupled to a slider attachment platform 302 (FIG. 3) of flexure 202, the slider likewise has freedom of rotation about dimple axis 210.

Figure 3:
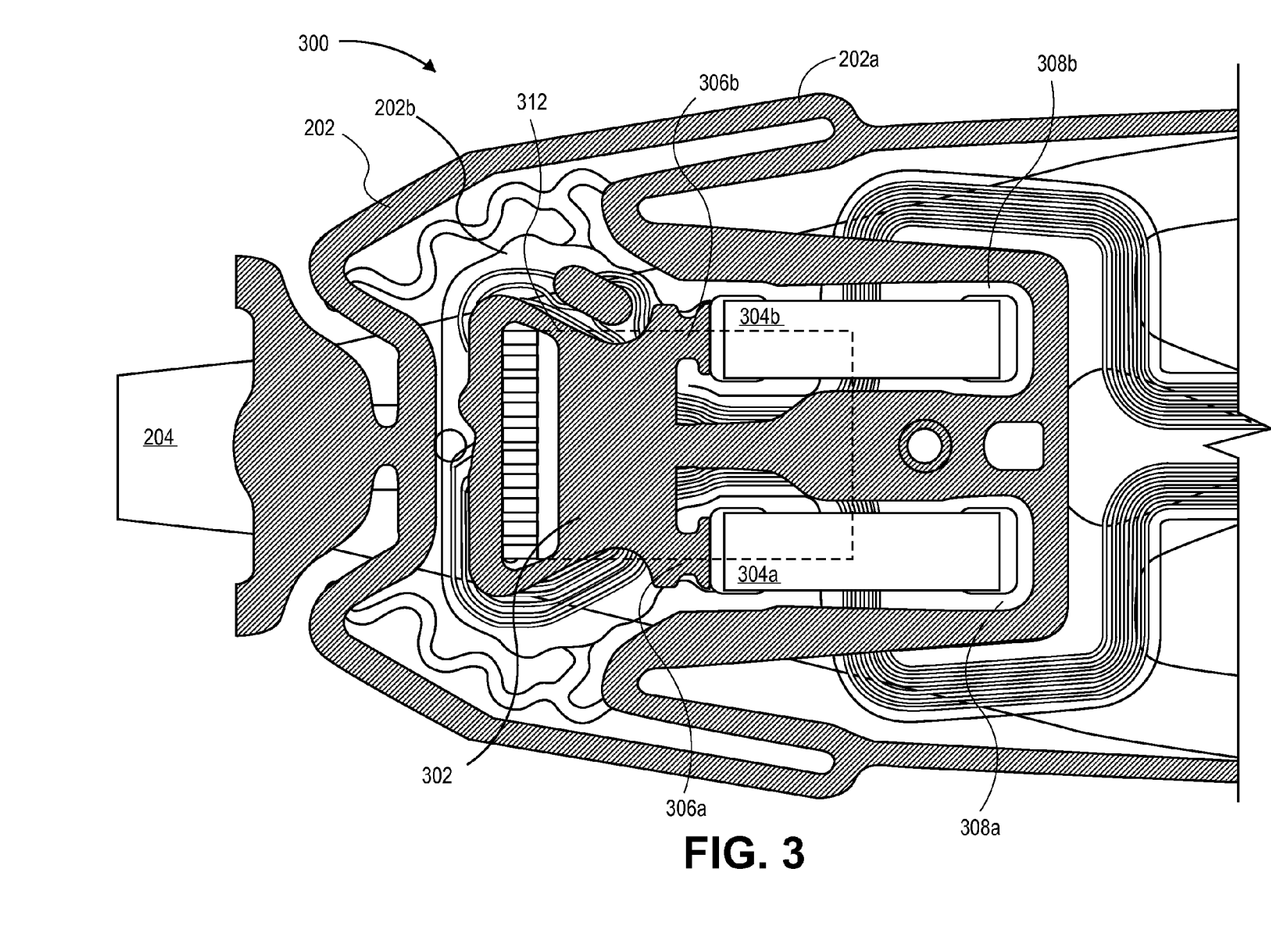
FIG. 3 is a bottom plan view illustrating a flexure gimbal assembly, according to an embodiment of the invention.

FIG. 3 is a bottom plan view illustrating a flexure gimbal assembly, according to an embodiment of the invention. Flexure gimbal assembly 300 comprises the flexure assembly 202, which may comprise the stainless steel layer 202a and the insulator layer 202b, movably coupled with load beam 204 through a dimple 206 (FIG. 2). Flexure gimbal assembly 300 further comprises a slider attachment platform 302 on which a slider 312 (such as slider 110b of FIG. 1) is attached, and a piezo actuating device 304a and a piezo actuating device 304b attached. According to this embodiment the slider 312 and the piezo actuating devices 304a, 304b, are located on opposing sides of flexure assembly 202, where the slider side is arbitrarily referred to as the top side and the piezo side is arbitrarily referred to as the bottom side.

Each piezo actuating device 304a, 304b is mounted at one end (distal end) to a respective piezo hinge 306a and piezo hinge 306b, and at the other end (proximal end) to a respective leading edge portion 308a and leading edge portion 308b, of a flexure tongue. The microactuator selectively rotates the slider 312 about the dimple axis 210 (FIG. 2). Opposite polarity voltage is applied to the two different piezo actuating devices 304a and 304b, such that one piezo expands and the other piezo contracts to rotate the slider 312 under a corresponding moment force. Piezo hinge 306a and piezo hinge 306b allow the two different piezos to simultaneously extend and contract in a linear manner, while allowing the slider attachment platform 302 and the slider 312 to rotate.

Reducing Ion Migration in a Flexure Assembly

Figure 4:
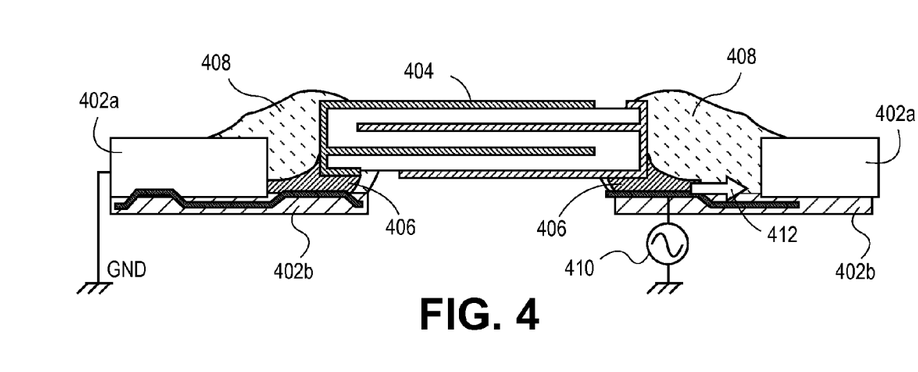
FIG. 4 is a cross-sectional side view illustrating a portion of the flexure assembly of FIG. 3, according to an embodiment of the invention.

FIG. 4 is a cross-sectional side view illustrating a portion of the flexure assembly of FIG. 3, according to an embodiment of the invention. The flexure assembly of FIG. 4 comprises a piezo actuating device 404 adhered to a flexure, which includes an electrically conductive (spring) layer 402a, such as stainless steel, and an insulating layer 402b that includes the flexure tongue. Piezo actuating device 404 is affixed at each end to corresponding areas of the flexure insulating layer 402b using an electrically conductive adhesive 406, such as a silver (Ag) paste. The adhesive area at each end of the piezo actuating device 404, including a portion of the conductive adhesive 406, is encapsulated with an insulating material 408 which is positioned between the conductive adhesive 406 and the conductive layer 402a of the flexure. Piezo actuating device 404 is driven to either expand or contract, as previously described, by applying a driving voltage from a voltage source 410.

Figure 5A:
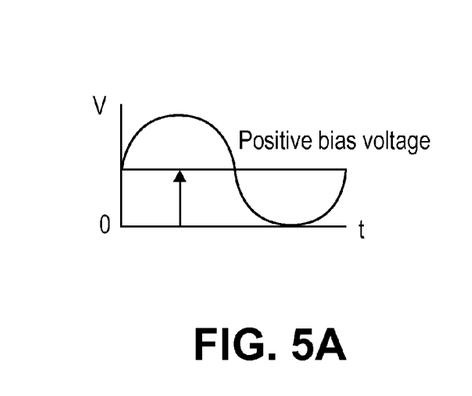
FIG. 5A is a diagram illustrating a piezo actuator driving voltage.

FIG. 5A is a diagram illustrating a piezo actuator driving voltage. The driving voltage drives the operation, i.e., the expansion and contraction, of the piezo actuating device 404 (FIG. 4). Typically, a positive bias voltage (AC) is applied to operate the piezo actuating device 404, as represented by the sine wave of FIG. 5A. The positive bias voltage provides for a positive RMS (root mean square) AC voltage across the entire cycle of a corresponding AC waveform, as depicted in FIG. 5A.

However, even though the electrical and mechanical connection of the piezo actuating device 404 and the flexure with the electrically conductive adhesive 406 is a practical implementation, the distance between the connection pad of piezo actuating device 404 and the conductive layer 402a of the flexure is highly restricted in the small area of the flexure tongue and, therefore, poses challenges. For example, it has been observed that the conductive adhesive 406, such as silver, transfers to an area with low electric potential by ion and/or atom migration, as represented by migration arrow 412. Over time, current leakage or an electrical short between the conductive adhesive 406 and the conductive layer 402a may occur. Consequently, it may become difficult to apply driving voltage to the piezo actuating device 404, or it may damage the drive circuit, either of which is an undesirable effect on the operational performance and the reliability of the microactuator system.

Figure 5B:
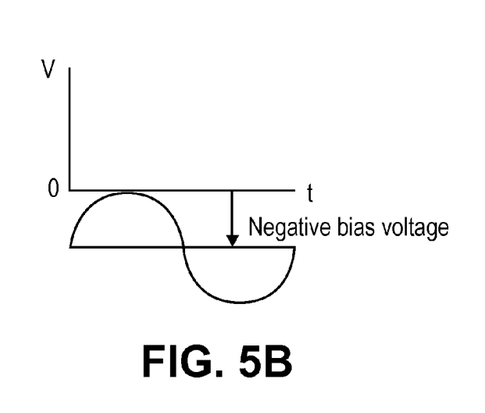
FIG. 5B is a diagram illustrating a piezo actuator driving voltage, according to an embodiment of the invention.

FIG. 5B is a diagram illustrating a piezo actuator driving voltage, according to an embodiment of the invention. Rather than applying a positive bias voltage (AC) to operate the piezo actuating device 404 (FIG. 4), as represented by the sine wave of FIG. 5A, according to an embodiment a negative bias driving voltage is applied to drive piezo actuating device 404, as represented by the sine wave of FIG. 5B. As depicted in FIG. 5B and according to an embodiment, the negative bias driving voltage provides for a negative RMS (root mean square) AC voltage across the entire cycle of a corresponding AC waveform. According to an embodiment, the negative bias driving voltage is lower than ground, i.e., the electric potential of the negative bias driving voltage is lower than ground potential, for one or more of the electrical traces connected to the piezo actuating device 404.

According to an embodiment and with reference to FIG. 4, the negative bias driving voltage is such that it inhibits, or may prevent, the migration of ions (and/or atoms) of the electrically conductive adhesive 406 to the electrically conductive layer 402a of the flexure. Consequently, an electrical short between the conductive adhesive 406, and likewise the piezo actuating device 404, and the conductive layer 402a is less likely to occur. Similarly, and according to an embodiment, the negative bias driving voltage is such that it inhibits the degradation of the resistance of the encapsulating insulating material 408. Again, an electrical short between the piezo actuating device 404 and the conductive layer 402a, and/or current leakage generally, is less likely to occur. Thus, undesirable electrical shorts or current leakage due to ion migration associated with the electrically conductive adhesive and/or due to resistance degradation of the insulating material used to encapsulate the conductive adhesive is inhibited and reduced. A longer and more reliable operational life-cycle of the microactuator system, generally, and the piezo actuating device 404, particularly, is therefore provided.

According to an embodiment, the negative bias driving voltage (see, e.g., FIG. 5B) is applied to the piezo actuating device 404 (FIG. 4) such that the negative RMS AC voltage serves as a low electric potential for the negative ('−') polarization direction of the piezo actuating device 404. That is, the negative bias driving voltage is applied so that the '−' side may serve as low electric potential of the polarization direction of a piezo element (+/−), and the '+' side may connect with ground of the piezo actuating device 404, and positive-side voltage is not used. Thus, the electric field concerning the piezo actuating device 404 is in the same direction as the direction of polarization of the piezo actuating device 404 and, therefore, the polarization of the piezo actuating device 404 does not readily deteriorate.

The voltage amplitude of the piezo driving voltage is limited by the strength of the piezo actuating device 404 (FIG. 4). However, the amplitude may be increased relative to the negative bias driving voltage represented in FIG. 5B to utilize some positive-side voltage. According to an embodiment a "reduced bias voltage" is utilized for the negative bias driving voltage.

Figure 5C:
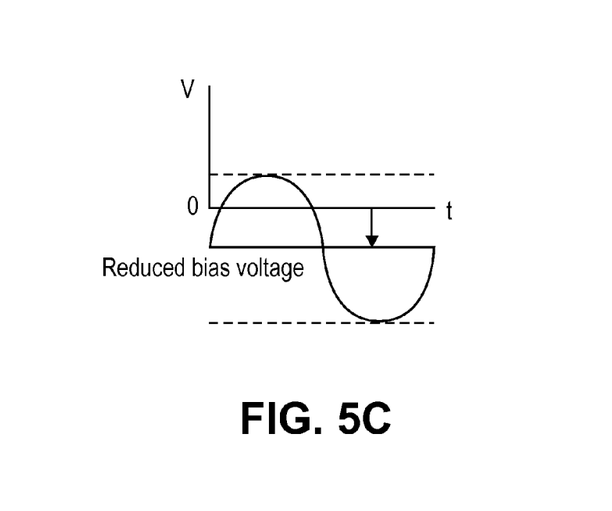
FIG. 5C is a diagram illustrating a piezo actuator driving voltage, according to an embodiment of the invention.

FIG. 5C is a diagram illustrating a piezo actuator driving voltage, according to an embodiment of the invention. Rather than applying a positive bias voltage (AC) to operate the piezo actuating device 404 (FIG. 4) as represented by the sine wave of FIG. 5A, which can cause ion migration, or applying a pure negative bias driving voltage as represented by the sine wave of FIG. 5B, a reduced bias voltage is applied to piezo actuating device 404. As depicted in FIG. 5C and according to an embodiment, the reduced bias driving voltage provides for a negative RMS (root mean square) AC voltage across a majority of a corresponding AC waveform rather than across the entire waveform, and a driving signal having a larger amplitude than the negative bias driving voltage, as well as some positive-side voltage for utilization by a piezo actuating devices of suitable strength. Thus, the reduced bias voltage provides for a positive RMS AC voltage to the piezo actuating device 404 (FIG. 4) across a minority portion of the corresponding AC waveform (FIG. 5C) and is applied to the piezo actuating device 404 such that the positive RMS AC voltage serves as electric potential for the negative polarization direction of the piezo actuating device 404, preferably in a voltage range that does not cause polarization degradation of the piezo actuating device 404.

Manufacturing a Flexure Assembly

Figure 6:
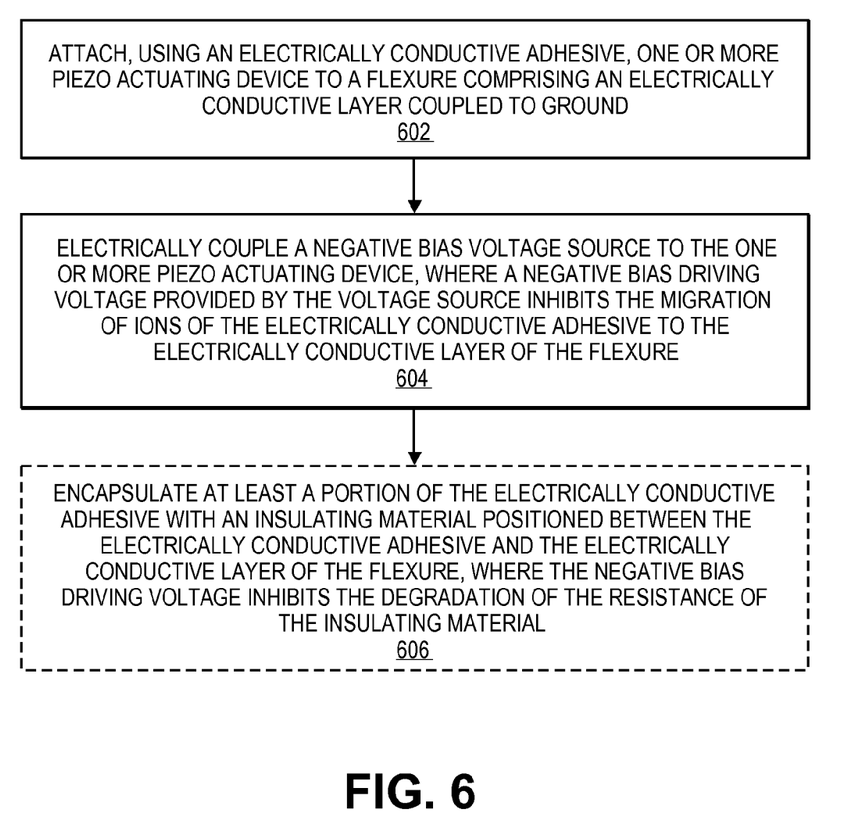
FIG. 6 is a flow diagram illustrating a method of manufacturing a flexure assembly, according to an embodiment of the invention.

FIG. 6 is a flow diagram illustrating a method of manufacturing a flexure assembly, according to an embodiment of the invention. At block 602, using an electrically conductive adhesive one or more piezo actuating device is attached to a flexure having an electrically conductive layer coupled to ground. For example, using electrically conductive adhesive 406 (FIG. 4) the piezo actuating device 404 (FIG. 4) is attached to the flexure 202 (FIGS. 2 and 3) which has a conductive spring layer 202a (FIG. 2), 402a (FIG. 4).

At block 604, a negative bias voltage source is electrically coupled to the one or more piezo actuating device, where a negative bias driving voltage provided by the voltage source inhibits the migration of ions (and/or atoms) of the electrically conductive adhesive to the electrically conductive layer of the flexure. For example, voltage source 410 (FIG. 4) is coupled to the piezo actuating device 404 (FIG. 4) by way of lead suspension traces 110c (FIG. 1) and negative bias driving voltage (e.g., FIG. 5B, FIG. 5C) provided by the voltage source 410 inhibits the migration of silver ions from the electrically conductive adhesive 406 (FIG. 4) to the conductive spring layer 402a (FIG. 4) of the flexure 202 (FIGS. 2 and 3).

At optional block 606 (depicted as optional by use of dashed block), at least a portion of the electrically conductive adhesive is encapsulated with an insulating material positioned between the conductive adhesive and the electrically conductive layer of the flexure, where the negative bias driving voltage inhibits the degradation of the resistance of the insulating material. For example, at least a portion of the electrically conductive adhesive 406 (FIG. 4) is encapsulated with an insulating material 408 (FIG. 4) positioned between the conductive adhesive 406 and the electrically conductive layer 402a (FIG. 4) of the flexure 202 (FIGS. 2 and 3), where the negative bias driving voltage (e.g., FIG. 5B, FIG. 5C) inhibits the degradation of the resistance of the insulating material 408.

Thus, a flexure assembly is provided which inhibits and reduces (compared with previous microactuator flexure assemblies) undesirable electrical shorts or current leakage due to ion migration associated with the electrically conductive adhesive and/or due to resistance degradation of the insulating material used to encapsulate the conductive adhesive.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A flexure assembly for a hard disk drive, comprising:
   a flexure comprising:
      an electrically conductive spring layer connected to ground, and
      an insulating layer comprising a flexure tongue;
   a voltage source trace;
   a microactuator comprising one or more piezo actuating devices coupled to said flexure tongue with electrically conductive adhesive and configured to provide a moment force for rotating a head slider in response to a negative bias driving voltage provided by said voltage source trace; and
   in response to said one or more piezo actuating devices receiving said negative bias driving voltage provided by said voltage source trace, which provides for a negative root mean square (RMS) AC voltage to said one or more piezo actuating devices across at least a majority of a corresponding AC waveform, (a) ions or atoms or (b) ions and atoms of said electrically conductive adhesive are inhibited from migrating to said electrically conductive spring layer of said flexure.

2. The flexure assembly of claim 1, comprising:
an insulating material encapsulating at least a portion of said electrically conductive adhesive and positioned between said electrically conductive adhesive and said electrically conductive spring layer of said flexure; and
in response to receiving said negative bias driving voltage, degradation of the resistance of said insulating material is inhibited.

3. The flexure assembly of claim 1, wherein said negative bias driving voltage is lower than said ground.

4. The flexure assembly of claim 1, wherein said negative bias driving voltage provides for a negative root mean square (RMS) AC voltage to said one or more piezo actuating devices across an entire corresponding AC waveform.

5. The flexure assembly of claim 4, wherein said negative bias driving voltage is applied to a said one or more piezo actuating devices such that said negative root mean square (RMS) AC voltage serves as a low electric potential for the negative polarization direction of said one or more piezo actuating devices.

6. The flexure assembly of claim 1, wherein said negative bias driving voltage is a reduced bias voltage that provides for a negative root mean square (RMS) AC voltage to said one or more piezo actuating devices across a majority of a corresponding AC waveform.

7. A hard disk drive, comprising:
a disk media rotatably mounted on a spindle;
a voltage source;
a suspension coupled to an actuator arm, said suspension comprising:
a flexure comprising:
an electrically conductive spring layer connected to ground, and
an insulating layer comprising a flexure tongue;
a microactuator comprising one or more piezo actuating devices coupled to said flexure tongue with electrically conductive adhesive and configured to provide a moment force for rotating a head slider in response to a driving voltage from said voltage source, said driving voltage being a negative bias driving voltage that provides for a negative root mean square (RMS) AC voltage to said one or more piezo actuating devices across at least a majority of a corresponding AC waveform; and
a voice coil motor configured to move said suspension and said head slider to access portions of said disk media.

8. The hard disk drive of claim 7, wherein said negative bias driving voltage inhibits the migration of (a) ions or atoms or (b) ions and atoms of said electrically conductive adhesive to said electrically conductive spring layer of said flexure.

9. The hard disk drive of claim 7, said suspension comprising:
an insulating material encapsulating at least a portion of said electrically conductive adhesive and positioned between said electrically conductive adhesive and said electrically conductive spring layer of said flexure; and
wherein said negative bias driving voltage inhibits the degradation of the resistance of said insulating material.

10. The hard disk drive of claim 7, wherein said negative bias driving voltage is lower than said ground.

11. The hard disk drive of claim 7, wherein said negative bias driving voltage provides for a negative root mean square (RMS) AC voltage to said one or more piezo actuating devices across an entire corresponding AC waveform.

12. The hard disk drive of claim 11, wherein said negative bias driving voltage is applied to a said one or more piezo actuating devices such that said negative root mean square (RMS) AC voltage serves as a low electric potential for the negative polarization direction of said one or more piezo actuating devices.

13. The hard disk drive of claim 7, wherein said negative bias driving voltage is a reduced bias voltage that provides for a negative root mean square (RMS) AC voltage to said one or more piezo actuating devices across a majority of a corresponding AC waveform.

14. A method for manufacturing a flexure assembly for a hard disk drive, the method comprising:
attaching, using an electrically conductive adhesive, one or more piezo actuating devices to a flexure tongue of a flexure comprising an electrically conductive layer coupled to ground and an insulating layer comprising said flexure tongue;
electrically connecting a negative bias driving voltage source to said one or more piezo actuating devices; and
applying a negative bias driving voltage from said voltage source to said one or more piezo actuating devices to provide a negative root mean square (RMS) AC voltage to said one or more piezo actuating devices across at least a majority of a corresponding AC waveform, thereby inhibiting the migration of (a) ions or atoms or (b) ions and atoms of said electrically conductive adhesive to said electrically conductive layer of said flexure.

15. The method of claim 14, comprising:
encapsulating at least a portion of said electrically conductive adhesive with an insulating material positioned between said electrically conductive adhesive and said electrically conductive layer of said flexure, wherein said negative bias driving voltage inhibits the degradation of the resistance of said insulating material.

* * * * *

UNITED STATES PATENT AND TRADEMARK OFFICE
CERTIFICATE OF CORRECTION

PATENT NO. : 9,449,623 B2  
APPLICATION NO. : 14/295296  
DATED : September 20, 2016  
INVENTOR(S) : Hagiya et al.

Page 1 of 1

It is certified that error appears in the above-identified patent and that said Letters Patent is hereby corrected as shown below:

In the Claims

Column 8, on Line 59, remove the indent for the text "a voltage source trace".

Signed and Sealed this
Fourteenth Day of March, 2017

Michelle K. Lee
*Director of the United States Patent and Trademark Office*